United States Patent
Lo

(10) Patent No.: US 7,378,298 B2
(45) Date of Patent: May 27, 2008

(54) METHOD OF MAKING STACKED DIE PACKAGE

(75) Inventor: Wai Yew Lo, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 55 days.

(21) Appl. No.: 11/524,457

(22) Filed: Sep. 20, 2006

(65) Prior Publication Data

US 2007/0099341 A1    May 3, 2007

(30) Foreign Application Priority Data

Sep. 23, 2005   (MY) ............................... PI20054509

(51) Int. Cl.
*H01L 21/00* (2006.01)
(52) U.S. Cl. ....................... 438/108; 438/613
(58) Field of Classification Search ................ 257/737, 257/778; 438/108, 613
See application file for complete search history.

(56) References Cited

U.S. PATENT DOCUMENTS

| | | | |
|---|---|---|---|
| 5,973,403 A * | 10/1999 | Wark ........................... 257/777 |
| 6,080,264 A * | 6/2000 | Ball ............................ 156/292 |
| 6,157,080 A | 12/2000 | Tamaki et al. |
| 6,181,002 B1 | 1/2001 | Juso et al. |
| 6,229,217 B1 * | 5/2001 | Fukui et al. ................. 257/777 |
| 6,339,254 B1 | 1/2002 | Venkateshwaran et al. |
| 6,426,559 B1 * | 7/2002 | Bryan et al. ................. 257/777 |
| 2002/0045290 A1 | 4/2002 | Ball |
| 2002/0074637 A1 | 6/2002 | McFarland |
| 2004/0070083 A1 | 4/2004 | Su |
| 2004/0217485 A1 | 11/2004 | Chung |
| 2005/0046040 A1 | 3/2005 | Wang et al. |

* cited by examiner

*Primary Examiner*—Roy K Potter
(74) *Attorney, Agent, or Firm*—Charles Bergere

(57) ABSTRACT

A method of making a stacked die package (39) includes placing a first flip chip die (16) on a base carrier (12) and electrically connecting the first flip chip die (16) to the base carrier (12). A second flip chip die (18) is attached back-to-back to the first flip chip die (16) and electrically connected to the base carrier (12) with a plurality of insulated wires (20). A mold compound (36) is formed over the first and second dice and one surface of the base carrier.

16 Claims, 4 Drawing Sheets

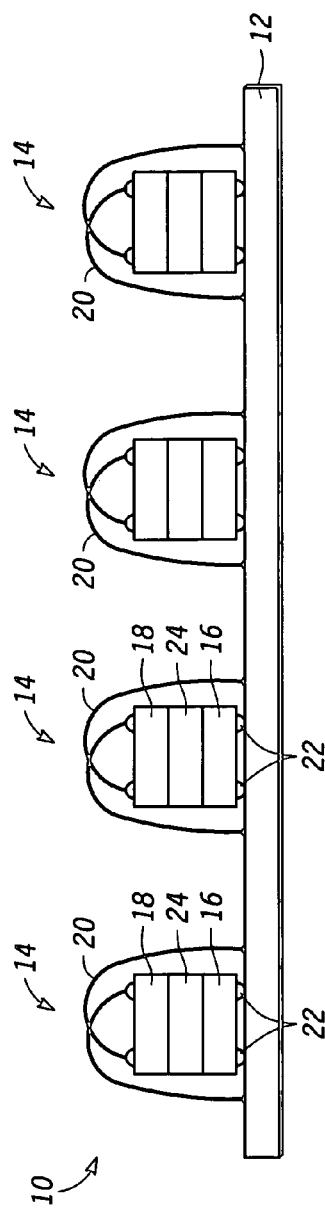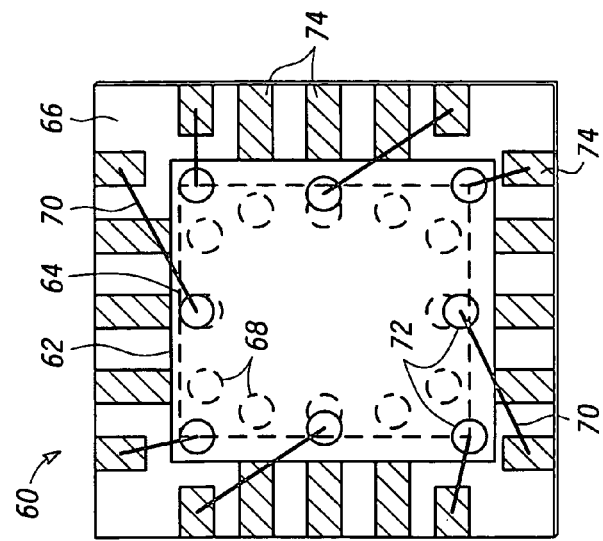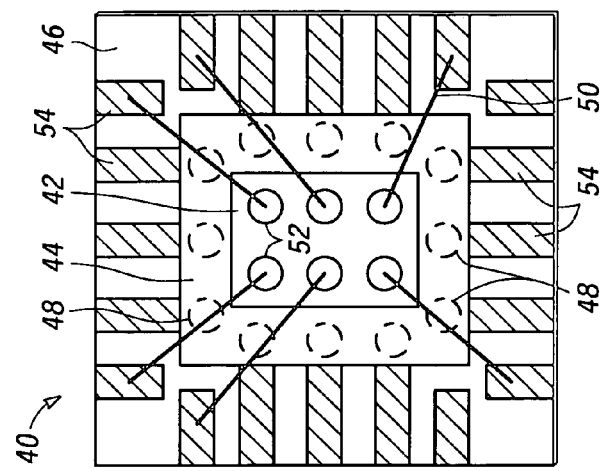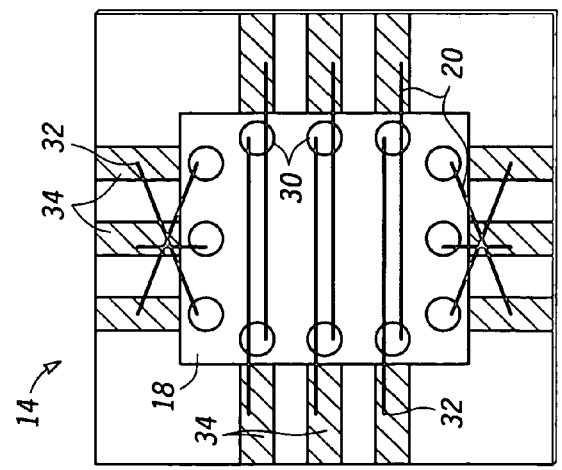
FIG. 1
FIG. 2
FIG. 3
FIG. 4

METHOD OF MAKING STACKED DIE PACKAGE

BACKGROUND OF THE INVENTION

The present invention relates to the packaging of integrated circuits (ICs) and more particularly to a method of making a stacked die package.

Stacked die packages are characterised by having two or more dice stacked within a single package. The stacking of two or more dice within a single package increases the functional integration of the package, without increasing its footprint. At present, dice in a stacked die package are typically either wirebond dice alone, or a combination of wirebond dice and a flip chip die. Most known methods of forming stacked flip chip packages are complicated and costly. Another drawback of existing methods is inflexibility in the sequence in which the dice are stacked. For example, some methods require dice of varying sizes be stacked from the largest at the bottom to the smallest on the top.

However, because of the advantages associated with the use of flip chip interconnections, semiconductor device manufacturers are currently developing methods of stacking multiple flip chip dice in a single package. It would be desirable to have a simple and inexpensive method of making a stacked package formed with only flip chip dice.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

FIG. 1 is an enlarged cross-sectional view of a substrate having a plurality of die stacks formed thereon in accordance with an embodiment of the present invention;

FIG. 2 is an enlarged top plan view of one of the die stacks of FIG. 1;

FIG. 3 is an enlarged top plan view of a die stack in accordance with one embodiment of the present invention;

FIG. 4 is an enlarged top plan view of a die stack in accordance with another embodiment of the present invention;

DETAILED DESCRIPTION OF THE INVENTION

Figure 5:
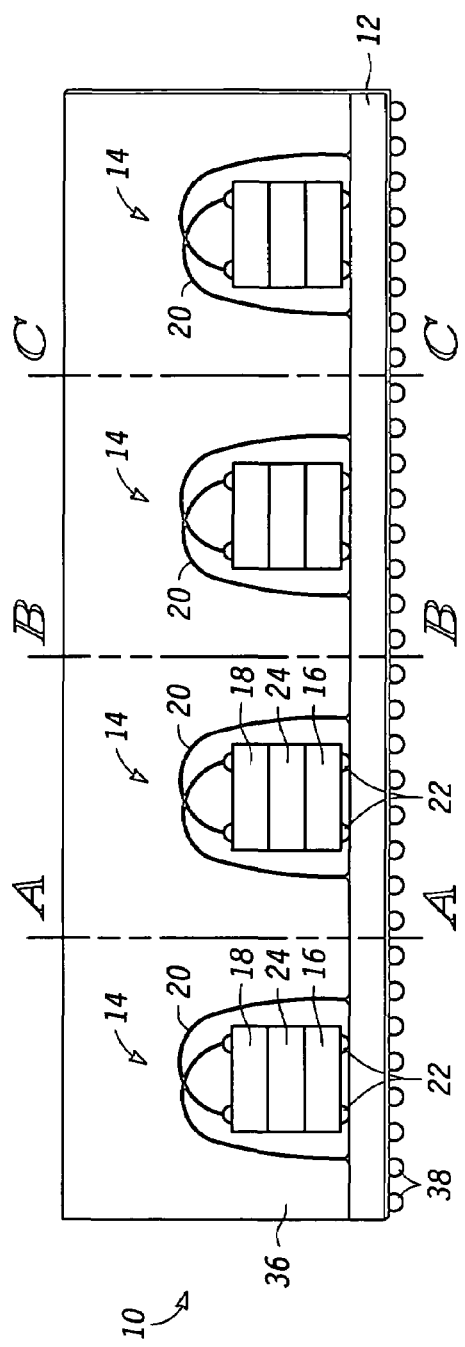
FIG. 5 is an enlarged cross-sectional view of a plurality of stacked die packages in accordance with an embodiment of the present invention.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a method of making a stacked die package including the steps of placing a first flip chip die on a base carrier and electrically connecting the first flip chip die to the base carrier. A second flip chip die is attached back-to-back to the first flip chip die and is electrically connected to the base carrier with a plurality of insulated wires.

The present invention also provides a method of making a stacked die package including the steps of placing a first flip chip die on a base carrier and electrically connecting the first flip chip die to the base carrier. A second flip chip die having an area array of bonding pads is attached back-to-back to the first flip chip die, and is electrically connected to the base carrier with a plurality of insulated wires.

The present invention further provides a method of making a plurality of stacked die packages including the step of placing a plurality of first flip chip dice on a base carrier and electrically connecting the first flip chip dice to the base carrier. A plurality of second flip chip dice is attached back-to-back to respective ones of the first flip chip dice. The second flip chip dice are electrically connected to the base carrier with a plurality of insulated wires. A molding operation is performed to encapsulate the first and second flip chip dice, the insulated wires and at least a portion of the base carrier.

FIGS. 1, 2 and 5 are enlarged, cross-sectional views that illustrate a method of making a plurality of stacked die packages 10 in accordance with an embodiment of the present invention. Referring now to FIG. 1, a base carrier 12 having a plurality of die stacks 14 formed thereon is shown. Each die stack 14 comprises a first flip chip die 16 placed on and electrically connected to the base carrier 12, and a second flip chip die 18 attached back-to-back to the first flip chip die 16. The second flip chip dice 18 are electrically connected to the base carrier 12 with a plurality of insulated wires 20. The second dice 18 provide additional IO functionality and application to the overall package.

In this particular example, the base carrier 12 is a substrate such as, for example, a Molded Array Process-Ball Grid Array (MAP-BGA) substrate or a Single Strip Ball Grid Array (PBGA). However, it will be understood by those of skill in the art that the base carrier 12 in the present invention is not limited to substrates. The base carrier 12 may, for example, be a lead frame (see base carrier 152 in FIGS. 6-8, described below).

As shown in FIG. 1, the first flip chip dice 16 are electrically connected to the base carrier 12 via a plurality of flip chip interconnections 22. The flip chip interconnections 22 are formed by placing a plurality of flip chip bumps on one side (front side) of the first flip chip dice 16 against a plurality of corresponding bonding pads on the base carrier 12 and subjecting the flip chip bumps to heat and/or vibration, as is known in the art, to electrically couple the flip chip bumps on the first dice 16 to the bonding pads on the base carrier 12. After the first flip chip dice are electrically coupled to the base carrier 12, a reflow operation is preferably performed.

The second flip chip dice 18 are attached to respective ones of the first flip chip dice 16 with an adhesive material 24 such as a tape or an epoxy, as is known by those of skill in the art. In this particular example, the first and second flip chip dice 16 and 18 have substantially the same length and substantially the same width. However, it will be understood that the present invention is not limited to such a die stacking sequence; in alternative embodiments, the second flip chip dice 18 may be somewhat larger or somewhat smaller than the first flip chip dice 16 (see FIGS. 3 and 4, described below). The present invention affords flexibility in the design of the stacked die package with its ability to accommodate a variety of stacking sequences. Typical first and second flip chip die sizes may range from 4 mm×4 mm to 12 mm×12 mm. However, the top and bottom dice 16 and 18 could be as small as 1 mm$^2$ as in the case of flip chip QFN dice and as big as up to 20 mm$^2$ in the case of a processor dice. The first and second flip chip dice 16 and 18 may also have the same thickness, however, this is not required. Depending on the required final package outline thickness, the first and second flip chip dice 16 and 18 may have a thickness ranging from about 2 mils (backgrinded) to about 30 mils (full wafer thickness). Each of the first and second flip chip dice 16 and 18 are of a type well known to those of ordinary skill in the art, such as processor chips, application specific integrated circuits (ASIC), etc., and further description of these components is not required for a complete understanding of the present invention.

The insulated wires 20 comprise a conductive core coated with an electrically insulating material. The conductive core preferably comprises gold or copper, while the electrically insulating material is an organic insulative coating, preferably having a thickness of about 0.5 μm to about 2.0 μm. As can be seen from FIG. 1, the wires 20 may cross over one another. However, because the wires 20 are insulated, the wires 20 may cross over one another without shorting. Hence, the entire surface of each second flip chip die 18 can be used for forming interconnections, for example, by area array wire bonding.

Referring now to FIG. 2, an enlarged top plan view of one of the die stacks 14 of FIG. 1 is shown. As can be seen from FIG. 2, the second flip chip die 18 includes a plurality of die bonding pads 30 situated along a periphery of the second flip chip die 18. However, it will be understood that the present invention is not limited by the arrangement of the die bonding pads 30 on the second flip chip die 18. The die bonding pads 30 may, in alternative embodiments, be laid out in an area array. First ends of the insulated wires 20 are bonded to a plurality of bumps formed on the die bonding pads 30 of the second flip chip die 18, while second ends 32 of the insulated wires 20 are bonded to respective traces or bonding pads 34 on the base carrier 12. In alternative embodiments, the first ends of the insulated wires 20 are directly bonded to the die bonding pads 30 of the second flip chip die 18, thereby doing away with the need for the second flip chip die 18 to have bumps. The use of unbumped flip chip dice reduces manufacturing cost.

FIGS. 3 and 4 are enlarged top plan views of die stacks 40 and 60 having different stacking sequences from the die stack 14 of FIG. 2.

Referring now to FIG. 3, the die stack 40 has a smaller second flip chip die 42 stacked over a larger first flip chip die 44. The first flip chip die 44 is electrically connected to a base carrier 46 via a plurality of flip chip interconnections 48, shown in dotted lines, while the second flip chip die 42 is electrically connected to the base carrier 46 via a plurality of insulated wires 50. First ends of the insulated wires 50 are bonded to respective bumps 52 on respective die bonding pads of the second flip chip die 42, while second ends of the insulated wires 50 are bonded to respective traces or bonding pads 54 on the base carrier 46.

Referring now to FIG. 4, the die stack 60 has a larger second flip chip die 62 stacked over a smaller first flip chip die 64. The first flip chip die 64 is electrically connected to a base carrier 66 via a plurality of flip chip interconnections 68 (shown in dotted lines), while the second flip chip die 62 is electrically connected to the base carrier 66 via a plurality of insulated wires 70. First ends of the insulated wires 70 are bonded to respective bumps 72 on respective die bonding pads of the second flip chip die 62, while second ends of the insulated wires 70 are bonded to respective traces or bonding pads 74 on the base carrier 66.

Referring now to FIG. 5, the stacked die packages 10 of FIG. 1 are shown. A molding operation is performed on the stacked die packages 10, which encapsulates the first and second flip chip dice 16 and 18, the insulated wires 20 and at least a portion of the base carrier 12 with a mold compound 36 such as an epoxy molding compound, as is commonly used in semiconductor packaging. A plurality of solder balls 38 may be attached to the base carrier 12 using a solder paste screen printing method or by flux or by other attachment methods known in the art. Adjacent ones of the die stacks 14 are separated along the vertical lines A-A, B-B and C-C by performing a singulating operation such as, for example, saw singulation to form individual stacked die packages 10. In this particular example, the singulating operation is performed after the attachment of the solder balls 38 to the base carrier 12. However, those of skill in the art will understand that the singulating operation can also be performed before the attachment of the solder balls 38 to the base carrier 12.

Figure 6:
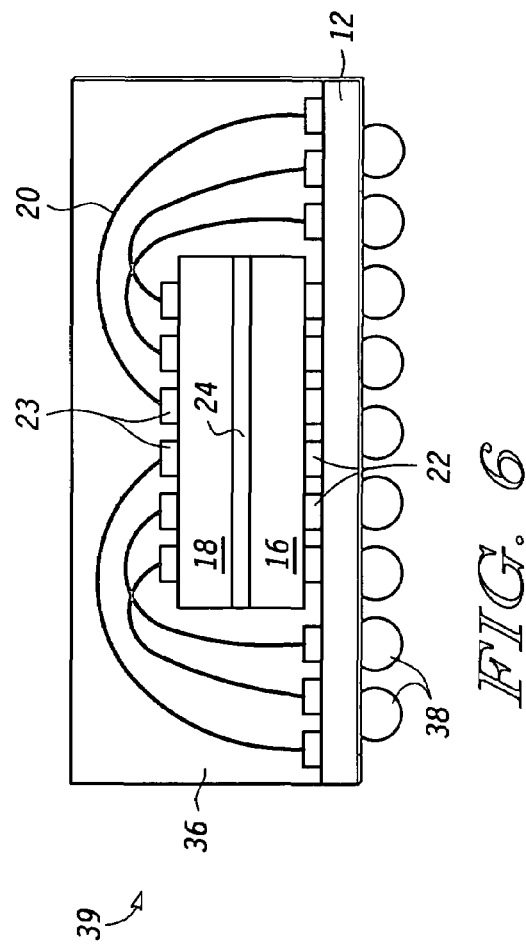
FIG. 6 is an enlarged cross-sectional view of one of the stacked die packages of FIG. 5.

FIG. 6 is an enlarged cross-sectional view of a stacked die package 39 formed in accordance with the procedure described above. The stacked die package 39 includes first and second flip chip dice 16 and 18 stacked back-to-back and attached to each other with an adhesive material 24. The first flip chip die 16 is electrically connected to the substrate 12 with flip chip interconnects (e.g., solder bumps) 22. The second flip chip die 18 is electrically connected to the substrate 12 with insulated wires 20. The insulated wires 20 are bonded at one end to solder bumps 23 formed on a surface of the second flip chip die 18 or direct bonding to the flip chip pads without the solder bumps. The first and second stacked flip chip dice 16 and 18, the insulated wires 20 and a top surface of the substrate 12 are covered with the mold compound 36. The solder balls 38 are attached to a bottom surface of the substrate 12 to allow the stacked die package 39 to be connected to other electrical components.

Figure 7:
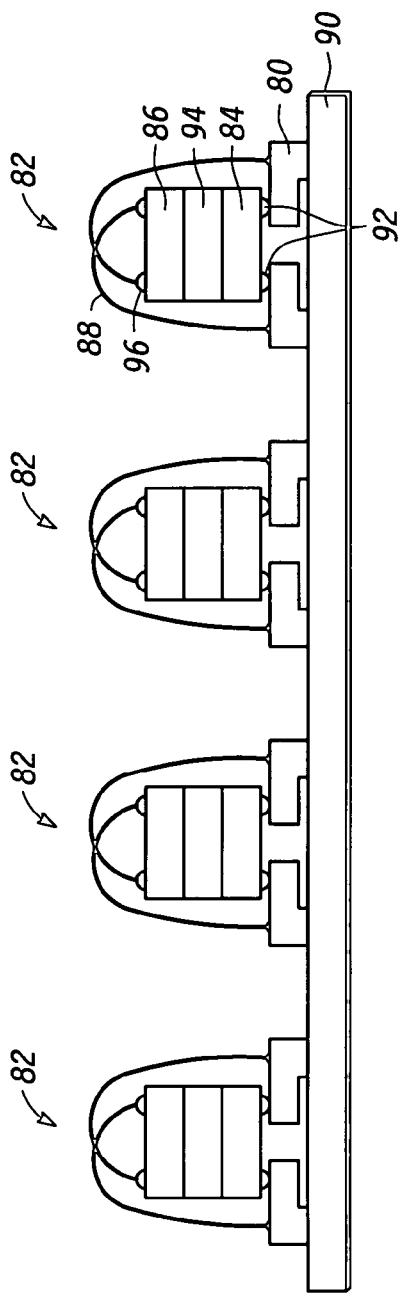
FIG. 7 is an enlarged cross-sectional view of a plurality of lead frames having a plurality of die stacks formed thereon in accordance with another embodiment of the present invention.
Figure 8:
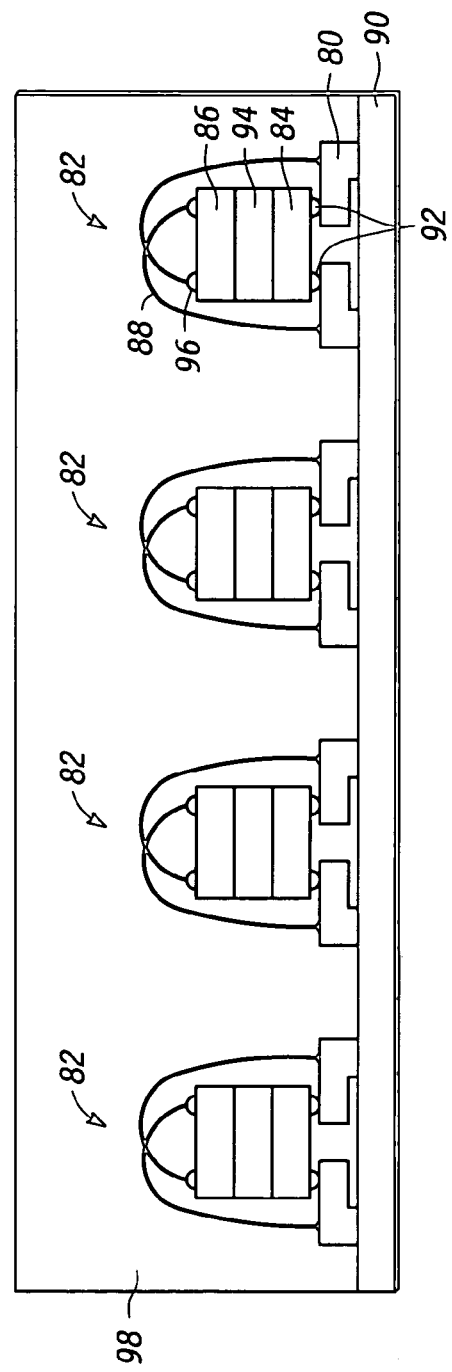
FIG. 8 is an enlarged cross-sectional view of the die stacks of FIG. 7 encapsulated by a mold compound.
Figure 9:
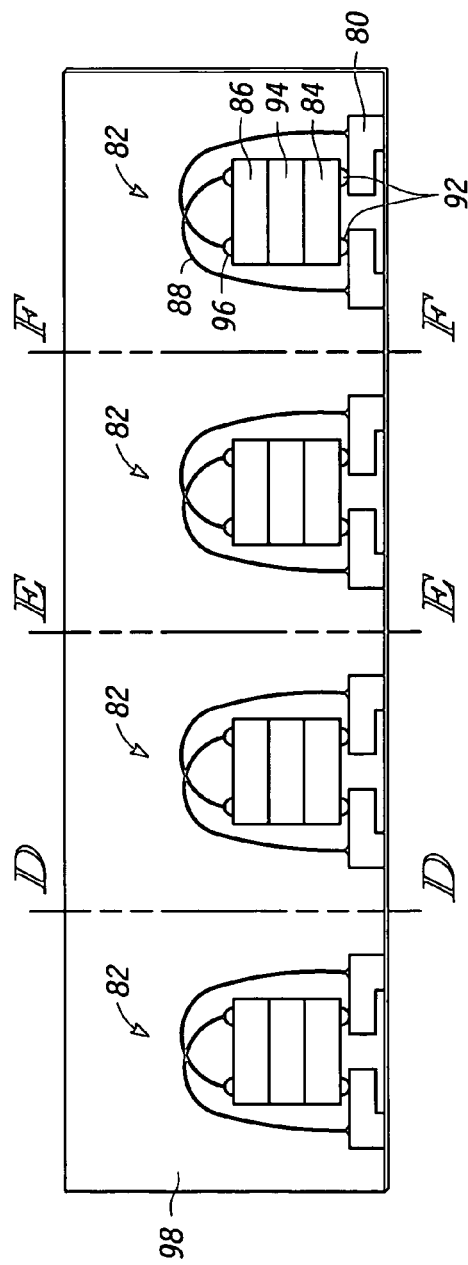
FIG. 9 is an enlarged cross-sectional view of the encapsulated die stack of FIG. 8 being singulated to form individual stacked die packages.

FIGS. 7 to 9 are enlarged cross-sectional views that illustrate a method of making a plurality of stacked die packages in accordance with another embodiment of the present invention.

Referring now to FIG. 7, a base carrier 80 having a plurality of die stacks 82 formed thereon is shown. Each die stack 82 includes a first flip chip die 84 placed on and electrically connected to the base carrier 80, and a second flip chip die 86 attached back-to-back to the first flip chip die 84. The second flip chip dice 86 are electrically connected to the base carrier 80 with a plurality of insulated wires 88.

In this particular example, the base carrier 80 is a lead frame such as, for example, a Quad Flat No-Lead (QFN) lead frame. The lead frame 80 is provided in an array of lead frames. A tape 90 such as, for example, a mold masking tape is attached to one side of the base carrier 80. The first flip chip dice 84 are electrically connected to the base carrier 80 via a plurality of flip chip interconnections 92. The flip chip interconnections 92 are formed by placing a plurality of flip chip bumps (not shown) on the first flip chip dice 84 against a plurality of leads (not shown) on the base carrier 80 and subjecting the flip chip bumps to heat, thereby forming the flip chip interconnections 92 between the first flip chip dice 84 and the base carrier 80.

The second flip chip dice 86 are attached to respective ones of the first flip chip dice 84 with an adhesive material 94 such as a tape or an epoxy, as is known by those of skill in the art. Although the first and second flip chip dice 84 and 86 in this particular example have substantially the same length and substantially the same width, it will be understood that the present invention is not limited to such a die stacking sequence. As previously mentioned, the second flip chip dice 86 may be somewhat larger or somewhat smaller than the first flip chip dice 84. Typical first and second flip chip die sizes may range from 1 mm×1 mm to 20 mm×20 mm. The first and second flip chip dice 84 and 86 may also have the same thickness, however, this is not required. Depending on the required final package outline thickness, the first and second flip chip dice 84 and 86 may have a thickness ranging from about 2 mils to about 30 mils. Each of the first and second flip chip dice 84 and 86 are of a type well known to those of ordinary skill in the art, and further description of these components is not required for a complete understanding of the present invention.

In this particular example, first ends of the insulated wires 88 are bonded to respective bumps 96 on respective die bonding pads (not shown) of the second flip chip dice 86, while second ends of the insulated wires 88 are bonded to the base carrier 80. As previously discussed, the first ends of the insulated wires 88 may, in alternative embodiments, be directly bonded to the respective die bonding pads of the second flip chip dice 86. The die bonding pads of each second flip chip die 86 may be laid out in an area array or situated along a periphery of the second flip chip die 86. As shown in FIG. 7, at least one of the wires 88 crosses over another. However, as previously discussed, the crossing of the wires 88 does not cause a short as the wires 88 are insulated. The insulated wires 88 comprise a conductive core coated with an electrically insulating material. As previously described, the conductive core preferably comprises gold or copper, while the electrically insulating material is an organic insulative coating, preferably having a thickness of about 0.5 μm to about 2.0 μm.

Referring now to FIG. 8, the die stacks 82 of FIG. 7 are encapsulated by a mold compound 98 such as an epoxy molding compound, as is commonly used in semiconductor packaging. More particularly, a molding operation is performed to encapsulate the first and second flip chip dice 84 and 86, the insulated wires 88 and at least a portion of the base carrier 80 with the mold compound 98.

Referring now to FIG. 9, the tape 90 is removed from the encapsulated die stacks 82 of FIG. 7. Adjacent ones of the die stacks 82 are then separated along the vertical lines D-D, E-E and F-F by performing a singulating operation such as, for example, saw singulation to form individual stacked die packages. In this particular example, the singulating operation is performed after the removal of the tape 90 from the base carrier 80. However, those of skill in the art will understand that the singulating operation can also be performed before the tape 90 is removed from the base carrier 80.

Figure 10:
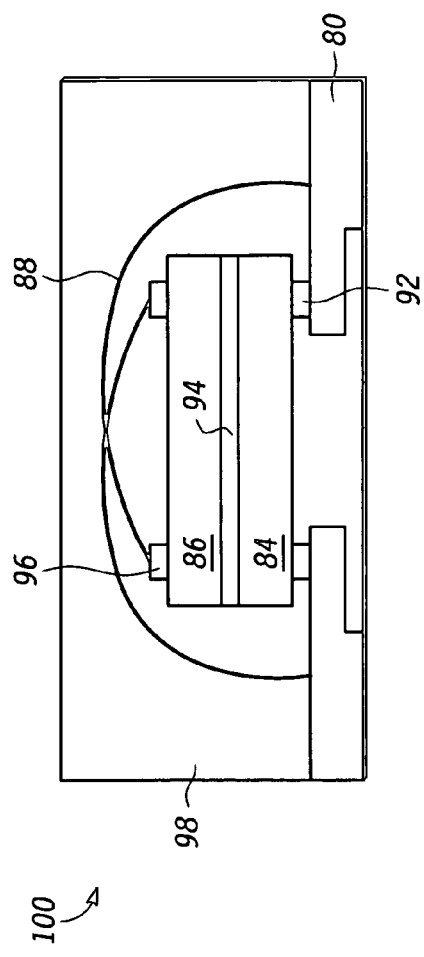
FIG. 10 is an enlarged cross-sectional view of one of the stacked die packages of FIG. 9.

FIG. 10 shows a QFN type stacked flip chip dice package 100 formed in accordance with the process described above with respect to FIGS. 7-9. Note that portions of the base carrier 80 are exposed along the bottom and sides of the package 100.

While a method of making a stacked die package has been described, the present invention further is a stacked die package, including a base carrier; a first flip chip die placed on and electrically connected to the base carrier; and a second flip chip die attached back-to-back to the first flip chip die and electrically connected to the base carrier with a plurality of insulated wires. At least one of the insulated wires may cross over another.

First ends of the insulated wires may be bonded to respective bumps on respective die bonding pads of the second flip chip die, while second ends of the insulated wires are bonded to the base carrier. In an alternative embodiment, the first ends of the insulated wires may be bonded to respective die bonding pads of the second flip chip die. The die bonding pads of the second flip chip die may be situated along a periphery of the second flip chip die or laid out in an area array.

The first and second flip chip dice may have substantially the same length and substantially the same width. In an alternative embodiment, the second flip chip die may be larger than the first flip chip die.

The base carrier may be a substrate or a lead frame. The first flip chip die may be electrically connected to the base carrier with a plurality of flip chip bumps. The second flip chip die may be attached to the first flip chip die with a tape or an epoxy.

As is evident from the foregoing discussion, the present invention provides a simple and inexpensive method of making a stacked flip chip package that allows for variations in the sequence in which the flip chip dice are stacked. The present invention can be implemented using current semiconductor assembly equipment. Hence, there is no need for additional capital investment.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, the die sizes and the dimensions of the steps may vary to accommodate the required package design. It is understood, therefore, that this invention is not limited to the particular embodiments disclosed, but covers modifications within the spirit and scope of the present invention as defined by the appended claims.

The invention claimed is:

1. A method of making a stacked die package, comprising:
   placing a first flip chip die on a base carrier;
   electrically connecting the first flip chip die to the base carrier;
   attaching a second flip chip die back-to-back to the first flip chip die; and
   electrically connecting the second flip chip die to the base carrier with a plurality of insulated wires, wherein first ends of the insulated wires are bonded to respective bumps on respective die bonding pads of the second flip chip die and second ends of the insulated wires are bonded to the base carrier.

2. The method of making a stacked die package of claim 1, wherein the die bonding pads of the second flip chip die are laid out in an area array.

3. The method of making a stacked die package of claim 1, wherein the die bonding pads of the second flip chip die are situated along a periphery of the second flip chip die.

4. The method of making a stacked die package of claim 1, wherein the first and second flip chip dice have substantially the same length and substantially the same width.

5. The method of making a stacked die package of claim 1, wherein the second flip chip die is larger than the first flip chip die.

6. The method of making a stacked die package of claim 1, wherein at least one of the insulated wires crosses over another of the insulated wires.

7. The method of making a stacked die package of claim 1, further comprising performing a molding operation to encapsulate the first and second flip chip dice, the insulated wires and at least a portion of the base carrier.

8. The method of making a stacked die package of claim 7, wherein the second flip chip die is attached to the first flip chip die with one of a tape and an epoxy.

9. The method of making a stacked die package of claim 8, wherein the base carrier is one of a substrate and a lead frame.

10. The method of making a stacked die package of claim 9, wherein the first flip chip die is electrically connected to the base carrier with a plurality of flip chip interconnections.

11. A method of making a stacked die package, comprising;
  placing a first flip chip die on a base carrier;
  electrically connecting the first flip chip die to the base carrier;
  attaching a second flip chip die back-to-back to the first flip chip die, the second flip chip die having an area array of die bonding pads; and
  electrically connecting the second flip chip die to the base carrier with a plurality of insulated wires.

12. The method of making a stacked die package of claim 11, further comprising performing a molding operation to encapsulate the first and second flip chip dice, the insulated wires and at least a portion of the base carrier.

13. The method of making a stacked die package of claim 11, wherein the first and second flip chip dice have substantially the same length and substantially the same width.

14. The method of making a stacked die package of claim 11, wherein the second flip chip die is larger than the first flip chip die.

15. A method of making a plurality of stacked die packages, comprising:
  placing a plurality of first flip chip dice on a base carrier;
  electrically connecting the first flip chip dice to the base carrier;
  attaching a plurality of second flip chip dice back-to-back to respective ones of the first flip chip dice, thereby forming a plurality of die stacks;
  electrically connecting the second flip chip dice to the base carrier with a plurality of insulated wires, wherein the second flip chip dice have an area array of die bonding pads; and
  performing a molding operation to encapsulate the first and second flip chip dice, the insulated wires and at least a portion of the base carrier.

16. The method of making a plurality of stacked die packages of claim 15, further comprising performing a singulating operation to separate adjacent ones of the die stacks, thereby forming the plurality of stacked die packages.

* * * * *